US012235317B2

(12) United States Patent
Fanning

(10) Patent No.: US 12,235,317 B2
(45) Date of Patent: Feb. 25, 2025

(54) TEST SYSTEM THAT CONVERTS COMMAND SYNTAXES

(71) Applicant: Teradyne, Inc., North Reading, MA (US)

(72) Inventor: Richard W. Fanning, Jurupa Valley, CA (US)

(73) Assignee: Teradyne, Inc., North Reading, MA (US)

( * ) Notice: Subject to any disclaimer, the term of this patent is extended or adjusted under 35 U.S.C. 154(b) by 49 days.

(21) Appl. No.: 18/096,897

(22) Filed: Jan. 13, 2023

(65) Prior Publication Data

US 2024/0241173 A1  Jul. 18, 2024

(51) Int. Cl.
*G01R 31/317* (2006.01)
*G01R 31/319* (2006.01)

(52) U.S. Cl.
CPC . *G01R 31/31713* (2013.01); *G01R 31/31705* (2013.01); *G01R 31/31919* (2013.01)

(58) Field of Classification Search
None
See application file for complete search history.

(56) References Cited

U.S. PATENT DOCUMENTS

| 9,959,186 | B2 | 5/2018 | Hunter et al. | |
|---|---|---|---|---|
| 2004/0003328 | A1* | 1/2004 | Viens | G01R 31/31907 714/724 |
| 2018/0018249 | A1* | 1/2018 | Zhao | G06F 11/263 |

FOREIGN PATENT DOCUMENTS

WO    WO-2005109017 A2 *  11/2005    ......... G01R 31/319

OTHER PUBLICATIONS

Broadcom BCM8011 Product Brief, Broadcom Corporation, Irvine, California (2004), 2 pages.
TestStation™ Dynamic Programming Extension information sheet, Teradyne, Inc., North Reading, Massachusetts (2011), 2 pages.
Broadcom StrataDNX™ HBM Configuration and Debugging Guide, DNX-HBM-AN101-PUB (Dec. 2021), 40 pages.
TestStation™ Pro Software, TestStation Debug Pro information sheet, Teradyne, Inc., North Reading, Massachusetts (2023), 3 pages.
XJTAG, "What is JTAG and how can I make use of it?" XJTAG-JTAG-17K-02, XJTAG, Cambridge, UK [online] URL: https://www.xjtag.com/about-jtag/what-is-jtag/ (2023), 4 pages.
Fanning et al., Teradyne's PortBridge Software Expedites Silicon Bring-Up, Debug, Production Readiness and Foundry Feedback (presented on Sep. 28, 2022 at the International Test Conference).

* cited by examiner

*Primary Examiner* — Guerrier Merant
(74) *Attorney, Agent, or Firm* — ArentFox Schiff LLP

(57) ABSTRACT

An example test system includes a test instrument configured to test a device under test (DUT). The test instrument is configured to interact with the DUT using first commands having a first syntax. The test system also includes one or more processing devices configured (i) to receive a definitions file, where the definitions file includes information defining a second syntax that is used by a third party to communicate with the DUT, (ii) to receive second commands having the second syntax, (iii) to convert the second commands into the first commands having the first syntax based on the definitions file, and (iv) to send the first commands to the test instrument to enable the test instrument to interact with the DUT.

22 Claims, 14 Drawing Sheets

```
<test_configuration comment_parameters="#"
    end_of_line_comments_supported="true"
    command_separator="new_line"
    command_delimiter="whitespace"
    parameter_delimiter="comma">

<!-- I2C test definition file for ti TMP4xx series of temperature sensors -->

<test_literal name="REG_8_STATUS" value="0x2" />    <!-- 0[0..8]=BUSY/1=HIGH/2=LOW/4=CRIT/8=FAULT/16=ACK -->

<test_command name="Read_Status" protocol_family="I2C Controller">
        <command_parameter name="CheckCRC" default_value="true"/>
        <command_parameter name="ACKTag" default_value="ack" />
        <sequence_step name="Read">
            <step_parameter name="RegisterAddressByteCount" static_value="1" />
            <step_parameter name="RegisterAddress" literal="REG_8_STATUS" />
            <step_parameter name="ExpectDataByteCount" static_value="1" />
            <step_parameter name="ExpectData" static_value="" />
            <step_parameter name="DataMask" static_value="" />
            <step_parameter name="CheckCRC" linked_parameter="CheckCRC" />
            <step_return_field name="ack" linked_parameter="ACKTag" />
            <step_return_field name="data" linked_field="ReadData" />
        </sequence_step>
    </test_command>
</test_configuration>
```

The name can be any string that does not contain a delimiter specified

The protocol family can be any protocol the ATE supports.

| Protocol Family | Step Command | Parameters | Type | Required | Default / Notes |
|---|---|---|---|---|---|
| I2C Controller | | | | | |
| | Read | | | | |
| | | RegisterAddress | Hex/Binary | Yes | |
| | | ExpectDataByteCount | Integer | Yes | |
| | | ExpectData | Hex/Binary | No | Empty String |
| | | DataMask | Hex/Binary | No | Empty String |
| | | RegisterAddressByteCount | Integer | No | -1 (uses default) |
| | | CheckACKs | Boolean | No | True |
| | | ReadWhenA15itsMaskedOff | Boolean | No | False |
| | | default (Return field) | | | |
| | | ack (Return field) | | | |
| | Write | | | | |
| | | RegisterAddress | Hex/Binary | Yes | |
| | | Data | Hex/Binary | Yes | |
| | | DataByteCount | Integer | Yes | |
| | | RegisterAddressByteCount | Integer | No | -1 (uses default) |
| | | CheckACKs | Boolean | No | False |
| | | default/ack (Return field) | | | |
| | Wait | | | | |
| | | Time | Double | Yes | |
| | | Limit | String | No | Empty String (options y, c, o, f, p, n, u, m, k, N, G, T, P, E, Z, Y) |

TEST SYSTEM THAT CONVERTS COMMAND SYNTAXES

TECHNICAL FIELD

This specification describes example implementations of a test system configured to convert between a third party command syntax and a test system command syntax.

BACKGROUND

Test systems are configured to test the operation of electronic devices referred to as devices under test (DUTs). A test system may include test instruments to send signals that include commands and data to a DUT for testing. The commands and data may be part of a test protocol, which may be implemented by a test program created by the manufacturer of the DUT. The manufacturer of the DUT has a native syntax that the manufacturer uses to communicate with the DUT. This native syntax is different from the syntax used by the test system to communicate with the DUT.

SUMMARY

An example test system includes a test instrument configured to test a device under test (DUT). The test instrument is configured to interact with the DUT using first commands having a first syntax. The test system also includes one or more processing devices configured (i) to receive a definitions file, where the definitions file includes information defining a second syntax that is used by a third party to communicate with the DUT, (ii) to receive second commands having the second syntax, (iii) to convert the second commands into the first commands having the first syntax based on the definitions file, and (iv) to send the first commands to the test instrument to enable the test instrument to interact with the DUT. The example test system may include one or more of the following features either alone or in combination.

The one or more processing devices may be configured to receive test data from the DUT, and to output the test data in the second syntax to a debugging program. Individual ones of the second commands may convert to multiple ones of the first commands. The definitions file may be customized by the third party. The second syntax may be based on a communications protocol that is native to the third party for communication with the DUT.

The one or more processing devices may be configured to execute a parser to parse the information in the definitions file, and to identify characteristics of the second syntax based on the information. The information may identify at least one of: what defines comments in the second syntax, what defines command in the second syntax, or what defines parameters in the second syntax.

The second commands may be part of a test program received from the third party to test the DUT. The test instrument may be configured to interact with the DUT during production testing. During production testing, the test program may not changeable and a design of the DUT may be finalized. The one or more processing devices may be configured to receive test data from the DUT following production testing, and to output the test data in the second syntax to a computing system associated with the third party.

The conversion may be is a markup language format.

One or more machine-readable storage media may store instructions that are executable by one or more processing devices to enable a test instrument configured to test a device under test (DUT) to interact with the DUT using first commands having a first syntax. The instructions may executable by the one or more processing devices to perform operations that include receiving a definitions file, where the definitions file includes information defining a second syntax that is used by a third party to communicate with the DUT; receiving second commands having the second syntax; converting the second commands into the first commands having the first syntax based on the definitions file; and sending the first commands to the test instrument to enable the test instrument to interact with the DUT. The following features may also be included herewith, either alone or in combination.

The operations may include receiving test data from the DUT. and outputting the test data in the second syntax to a debugging program. Individual ones of the second commands may convert to multiple ones of the first commands.

The definitions file may be customized by the third party. The second syntax may be based on a communications protocol that is native to the third party for communication with the DUT. The operations may include executing a parser to parse the information in the definitions file; and identifying characteristics of the second syntax based on the information. The information may identify at least one of: what defines comments in the second syntax, what defines command in the second syntax, or what defines parameters in the second syntax. The second commands may be part of a test program received from the third party to test the DUT.

The test instrument may be configured to interact with the DUT during production testing. During production testing, the test program may not be changeable and a design of the DUT may be finalized. The operations may include receiving test data from the DUT following production testing; and outputting the test data in the second syntax to a computing system associated with the third party.

The conversion file may be in a markup language format.

Any two or more of the features described in this specification, including in this summary section, may be combined to form implementations not specifically described in this specification.

At least part of the devices, systems, and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the devices, systems, and processes described in this specification may be configured or controlled using a computing system comprised of one or more processing devices and memory storing instructions that are executable by the one or more processing devices to perform various control operations. The devices, systems, and processes described in this specification may be configured, for example, through design, construction, composition, arrangement, placement, programming, operation, activation, deactivation, and/or control.

The details of one or more implementations are set forth in the accompanying drawings and the following description. Other features and advantages will be apparent from the description and drawings, and from the claims.

DESCRIPTION OF THE DRAWINGS

FIGS. 2, 3, 4, 5, 6, 7, 8, 9, 10, and 11 show and label contents of an example definitions file that may be used in the examples processes described herein.

FIG. 13 is a table showing information about a third party command syntax.

FIG. 14 is a graphical user interface (GUI) implemented by a computer program used to debug executable code.

Like reference numerals in different figures indicate like elements.

DETAILED DESCRIPTION

Described herein are example implementations of automatic test equipment (ATE) configured to test a device under test (DUT). The ATE is configured to interact with the DUT using commands having a syntax referred to herein as "the ATE syntax". An example syntax includes rules for grammar and/or spelling that define instructions, parameters, variables, comments, and/or other features included in commands used to interact with the DUT. Stated otherwise, a syntax includes character structures that a computer can interpret. For example, comments may be delimited with double slashes or pound signs; instructions may be delimited with semicolons or spaces; parameters may include text identifying them, such as "Param( )"; variables may be delimited by angled brackets such as "< >"; and so forth. Different syntaxes may use the same symbols or text, but those symbols or text may have different meanings. Further, different syntaxes may include different types of commands to perform the same operations or functions, and those different types of commands may take or use different types and/or numbers of parameters, for example.

Figure 1:
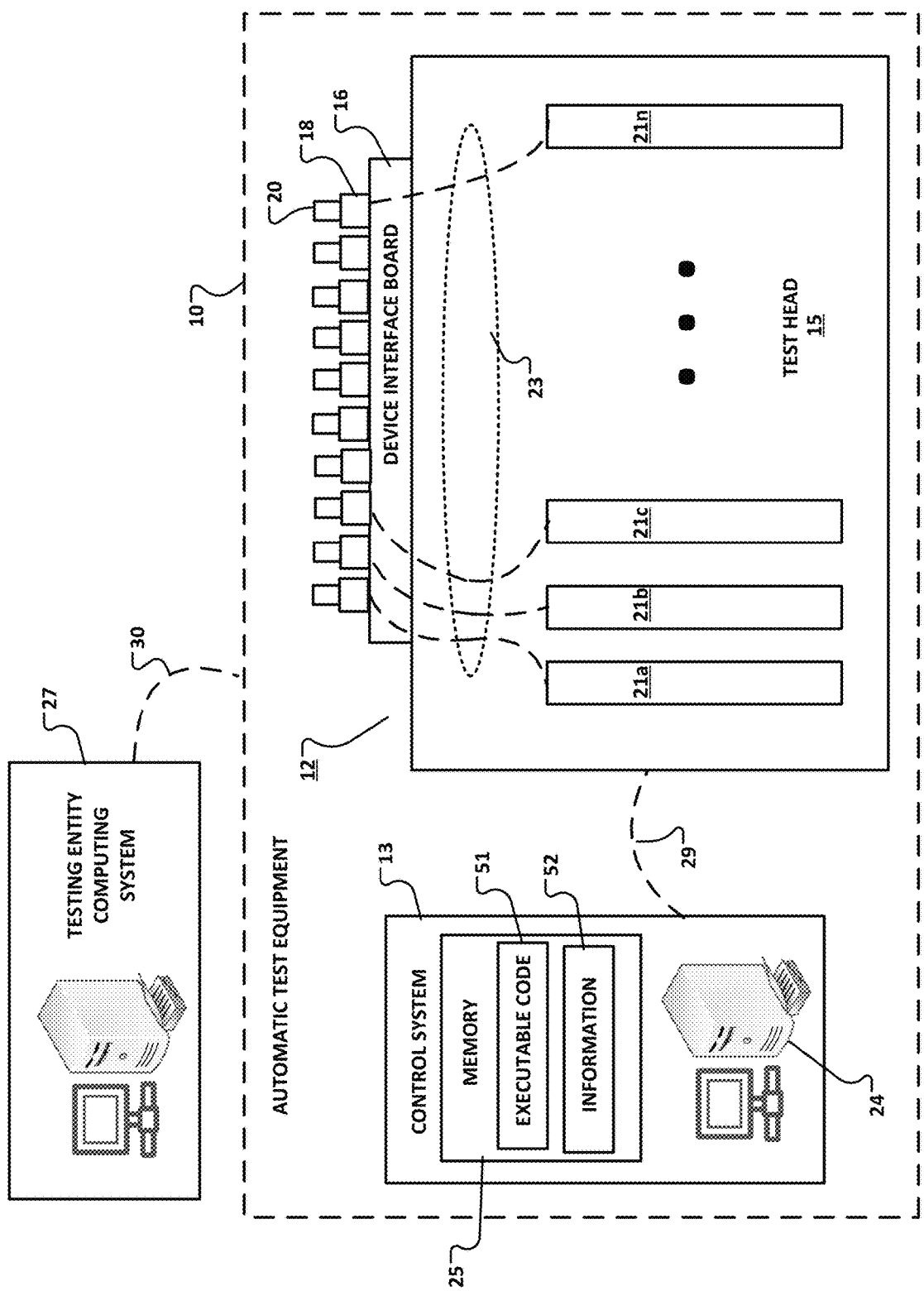
FIG. 1 is a block diagram showing components of an example test system on which the example processes described herein may be performed.

FIG. 1 is a block diagram showing components of example ATE 10 that includes a testing device/apparatus (referred to herein as a "tester") 12 and a control system 13.

Tester 12 includes a test head 15 and a device interface board (DIB) 16 connected physically and electrically to test head 15. In this example, DIB 16 includes a circuit board that includes mechanical and electrical interfaces at sites 18. One or more DUTs, such as DUT 20, connect to each of those sites for testing by the ATE. DIB 16 may include, among other things, connectors, conductive traces, conductive layers, and circuitry for routing signals between test instruments in the test head 15, DUTs connected to DIB sites, and other circuitry in the ATE. Power, including voltage, may be run via one or more layers in the DIB to DUTs connected to the DIB.

Test head 15 includes multiple test instruments 21a to 21n, each of which may be configured, as appropriate, to implement testing and/or other functions. Although only four test instruments are shown, ATE 10 may include any appropriate number of test instruments, including one or more residing outside of test head 15. The test instruments may be hardware devices that may include one or more processing devices and/or other circuitry. The test instruments may be configured—for example, programmed—to output commands to test DUTs held on the DIB. The commands to test the DUTs may be or include instructions, signals, data, parameters, variables, test patterns, and/or any other information designed to elicit response(s) from the DUT.

In some implementations, commands to test a DUT may be generated by executing or interpreting, on ATE 10, test program(s) received by ATE 10 from an external system. In an example, a test program may be or include a set of commands that are executed or interpreted by ATE 10 to produce commands that the ATE uses to test the DUT. In some implementations, individual commands or streams of commands may be received at ATE 10 from an external system and may be used to produce commands that the ATE uses to test the DUT. The test program and/or commands received from the external system may have a syntax that is different from the ATE syntax. As described herein, the ATE is configured to convert the test program and/or commands received from the external system into ATE-syntax commands and to use the ATE-syntax commands to test the DUT, as described in more detail below.

One or more—for example, all of—the test instruments may be configured to receive, from the DUT, responses to the commands sent from the ATE to the DUT. The responses are in the form or response signals. The test instruments may be configured to analyze the response signals to determine whether the DUT has passed or failed testing and/or to send the response signals to control system 13 for analysis.

Test channels 23 are configured between the test head and the DIB to enable communication between the DUTs and the test instruments. In some examples, a test channel may include the physical transmission medium or media over which commands are sent from the test instrument to a DUT and over which response signals are received from the DUT. Physical transmission media may include, but are not limited to, electrical conductors alone or in combination with optical conductors, wireless transmission media, or both optical conductors and wireless transmission media. In some examples, a test channel may include a range of frequencies over which signals are transmitted over a single transmission medium or over multiple transmission media of same or different types. Although only four test channels are shown in FIG. 1, any number of test channels may be included, e.g. one or more test channels per DUT.

Control system 13 is configured to—e.g., programmed to—communicate with test instruments 21a to 21n to direct and/or to control testing of the DUTs. In some implementations, this communication 29 may be over a computer network or via a direct connection such as a computer bus or an optical medium. In some implementations, the computer network may be or include a local area network (LAN) or a wide area network (WAN). The control system may be or include a computing system comprised of one or more processing devices 24 (e.g., microprocessor(s)) and memory 25 for storage. Control system 13 may be configured to provide test programs and/or commands to test instruments 21a to 21n in the test head, which the test instrument(s) use to test the DUT. Control system 13 may also be configured to receive response signals from test instrument(s) and to analyze the response signals to determine whether DUTs have passed or failed testing. Control system 13 may also be configured to communicate with third party computing systems, as described below.

The testing performed by ATE 10 may be or include debug testing, may be or include production testing, or may be or include both debug and production testing. Debug testing typically involves testing performed in cases where the design of the DUT and/or the testing protocol for the DUT has/have not yet been finalized. At this stage, DUTs are tested in order to identify design defects in the DUTs and/or to formalize a testing protocol for the DUTs. Debug testing may be performed in a laboratory setting, for example. Production testing is distinct from debug testing. Production testing is typically performed outside of a laboratory setting at, for example, a test site or test facility. At the time of production testing, the design of the DUT and testing protocol therefor have both been finalized. At this stage, the DUTs are being tested in order to identify which of them have operational defects and are not suitable for use or sale. In some cases, changes to the design of the DUT and/or the testing protocol for the DUT may not be permitted at the production testing stage.

An entity that designs the testing protocol for the DUTs (referred to herein as "the testing entity"), such as a manufacturer or producer of the DUTs, operates a computing system 27 configured to direct or to control testing of the DUTs via ATE 10. Computing system 27 may be comprised of one or more microprocessors or other appropriate processing devices as described herein. Computing system 27 may be in communication 30 with control system 13 over a computer network or via a direct path such as a computer bus or an optical medium. Computing system 27 may send test program(s) and/or individual commands and/or streams of commands to the ATE. These test program(s) and/or individual commands and/or streams of commands may be used by the ATE 10 in the manner described herein to implement one or more testing operations on the DUT during production testing, during debug testing, or during both production testing and debug testing.

The testing entity operates using a native syntax (referred to herein as "the entity syntax") that its computing system 27 understands and uses to communicate with the DUTs, including during testing. The entity syntax may be or include any information used by the testing entity to enable communications between its computing system and the DUT before, during, and/or after testing. The entity syntax is different from the ATE syntax. As such, absent the techniques described herein, ATE 10 would not understand the test program(s) and/or individual commands and/or streams of commands that ATE 10 receives from the test entity computing system 27.

In this regard, the techniques use a definitions file that the testing entity completes and sends to the ATE prior to testing. The definitions file may be in any appropriate format. In an example, the definitions file is in a self-describing computing language, such as extensible Markup Language (XML). The definitions file is readable by the ATE and defines the entity syntax. For example, the definitions file may include information defining commands and elements thereof in the test entity syntax including, but not limited to, one or more of the following: what characters or other information define comments in the test entity syntax, what characters or other information define instructions in the test entity syntax, what characters or other information define a parameter in the test entity syntax, what characters or other information define a static value parameter in the test entity syntax, what characters or other information define a literal value parameter in the test entity syntax, what characters or other information define variables in the test entity syntax, what characters or other information define data in the test entity syntax, what characters or other information define constants in the test entity syntax, what characters or other information define names in the test entity syntax, what characters or other information define a protocol family in the test entity syntax, what characters or other information separate commands and elements thereof in the test entity syntax, and so forth. Any information may be included in the definitions file that defines commands and elements thereof in the test entity syntax.

In some examples, including those above, characters or other information that define commands and elements thereof in the test entity syntax may include, but are not limited to, double slashes (//), pound signs (#), spaces, numbers of spaces, indentations, text (e.g., Param( )), angled brackets (< >), definitions statements, and so forth. There are no limits on the characters or other information that define commands and elements thereof in the test entity syntax; the definitions file will include whatever the test entity employs in the test entity syntax to define commands for testing.

Figure 2:
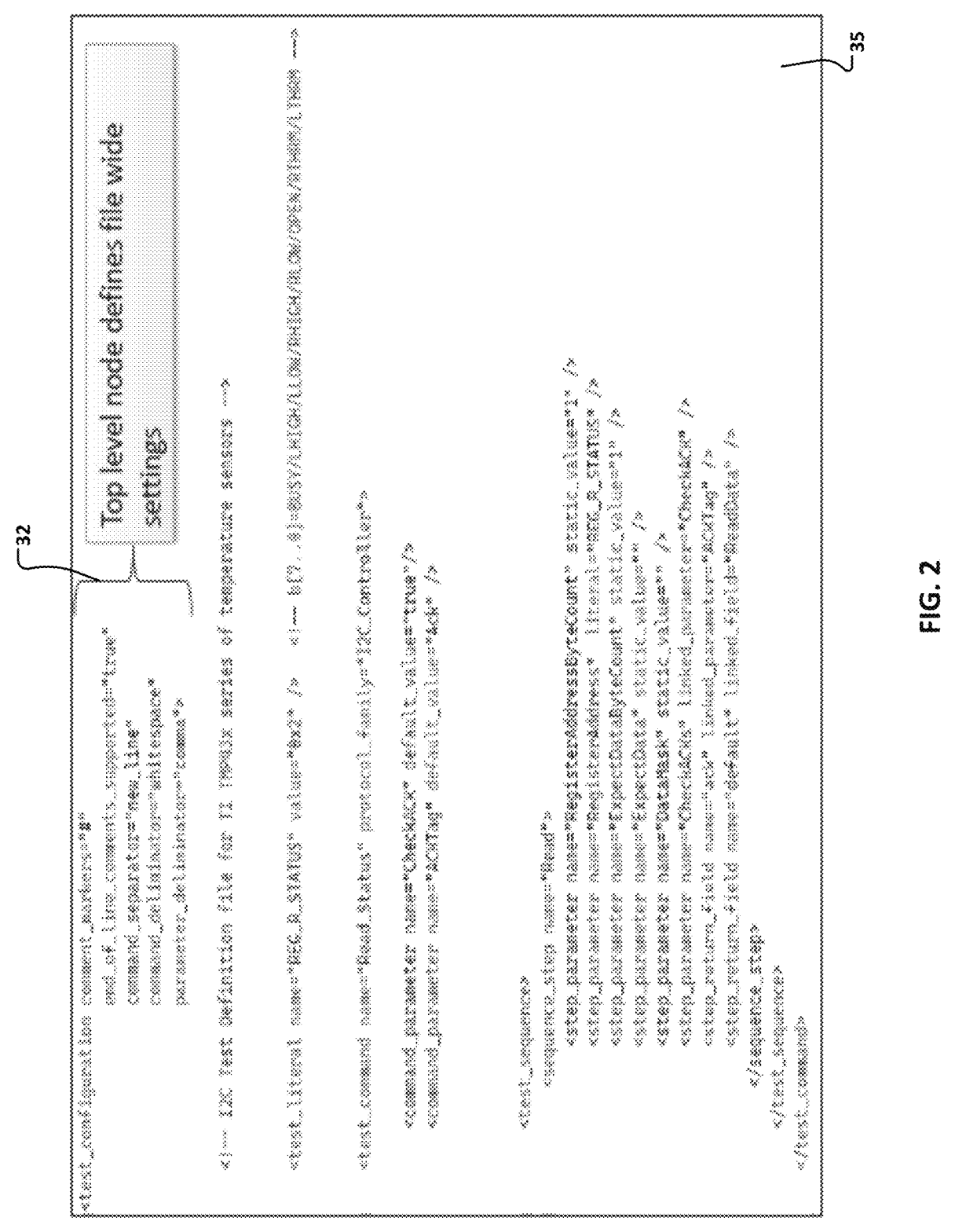
Figure 3:
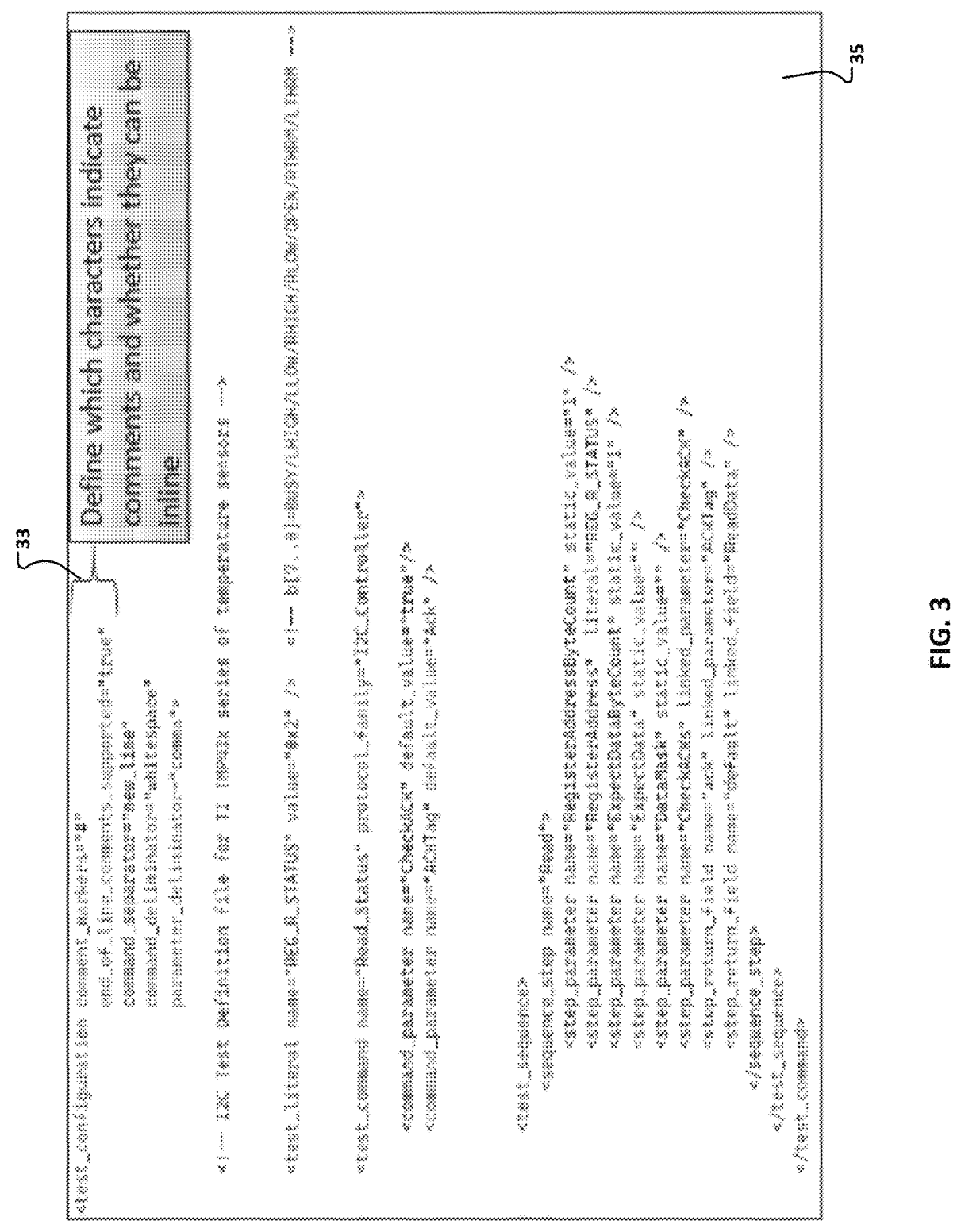
Figure 5:
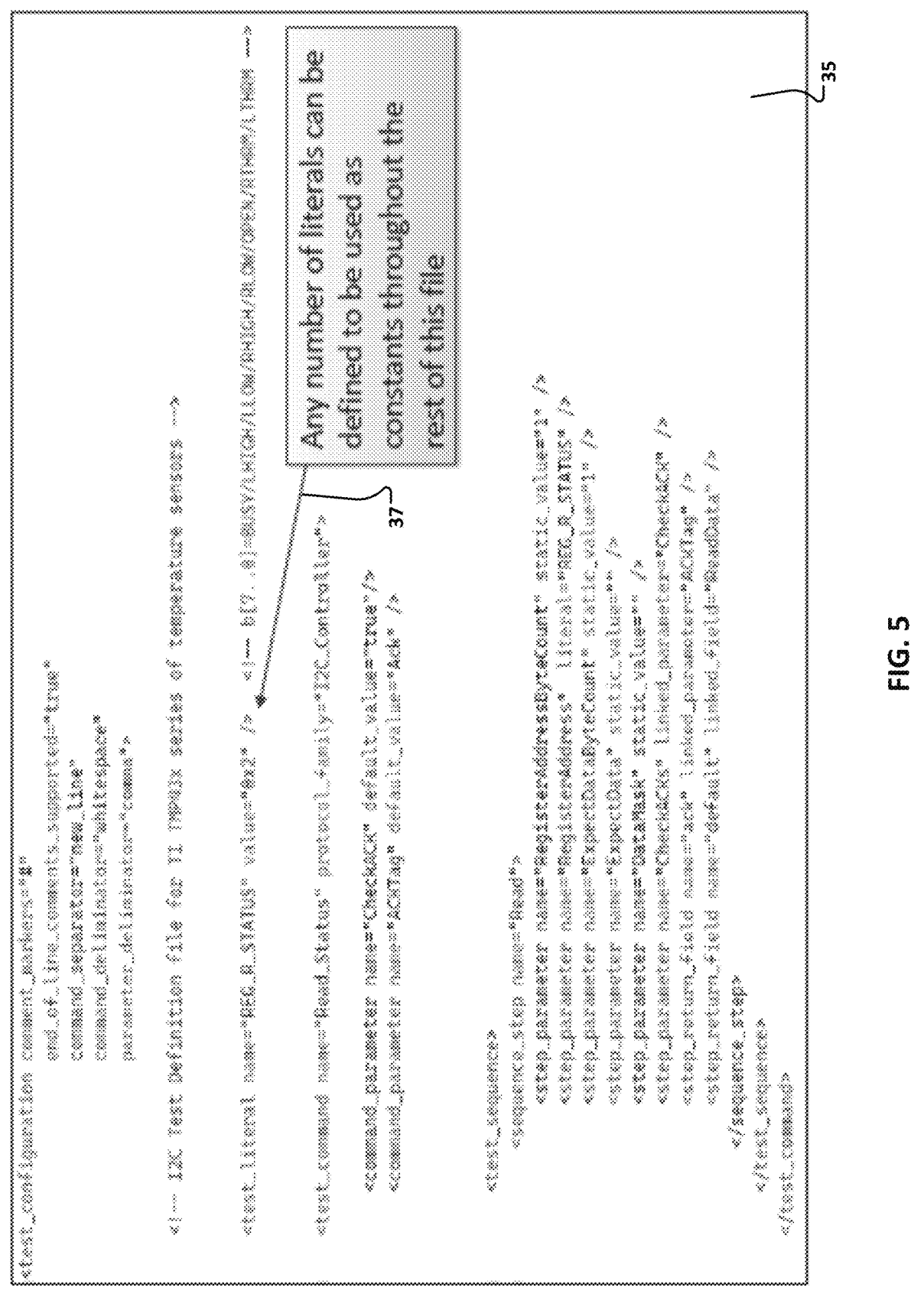
Figure 7:
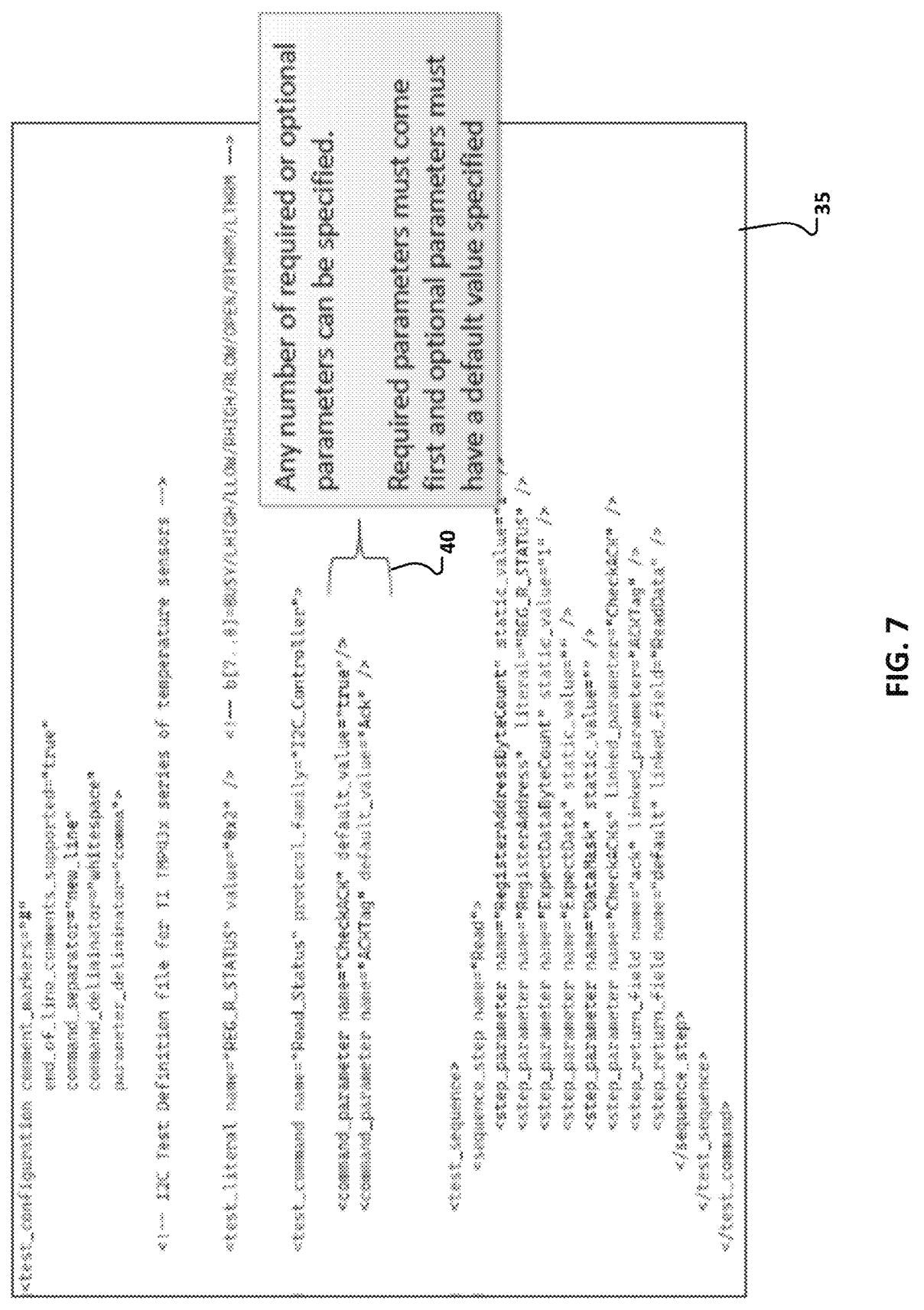
Figure 8:
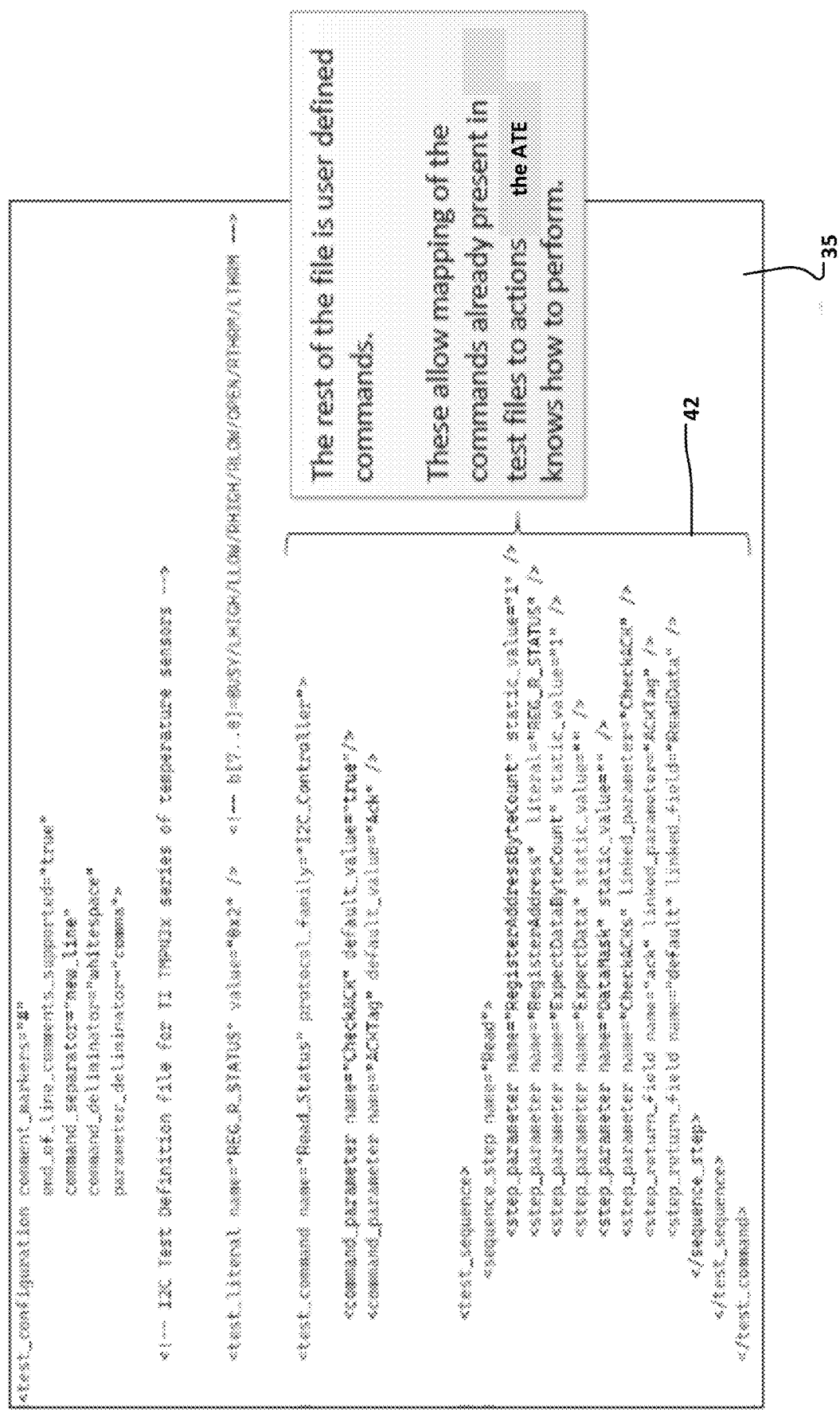
Figure 9:
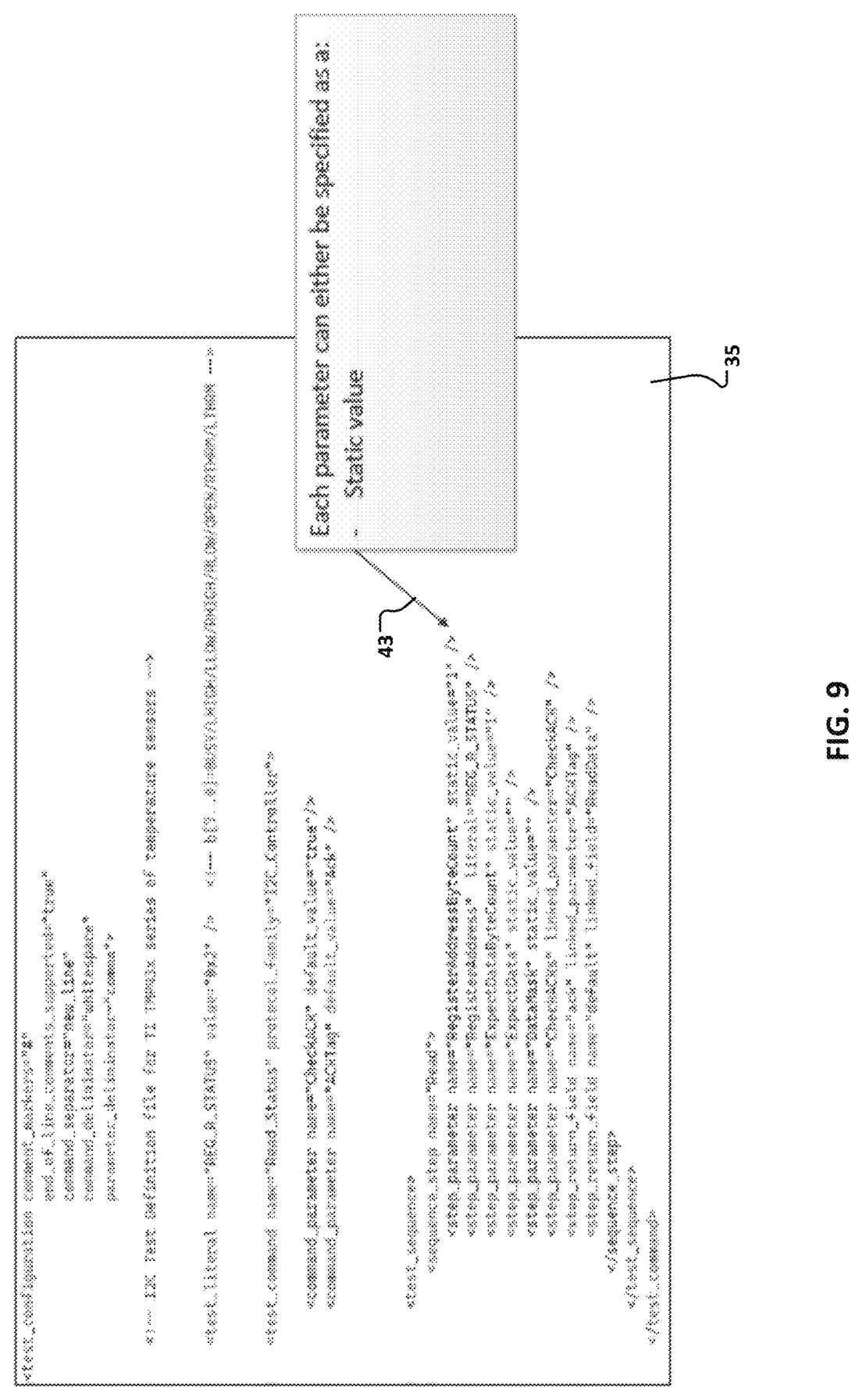
Figure 10:
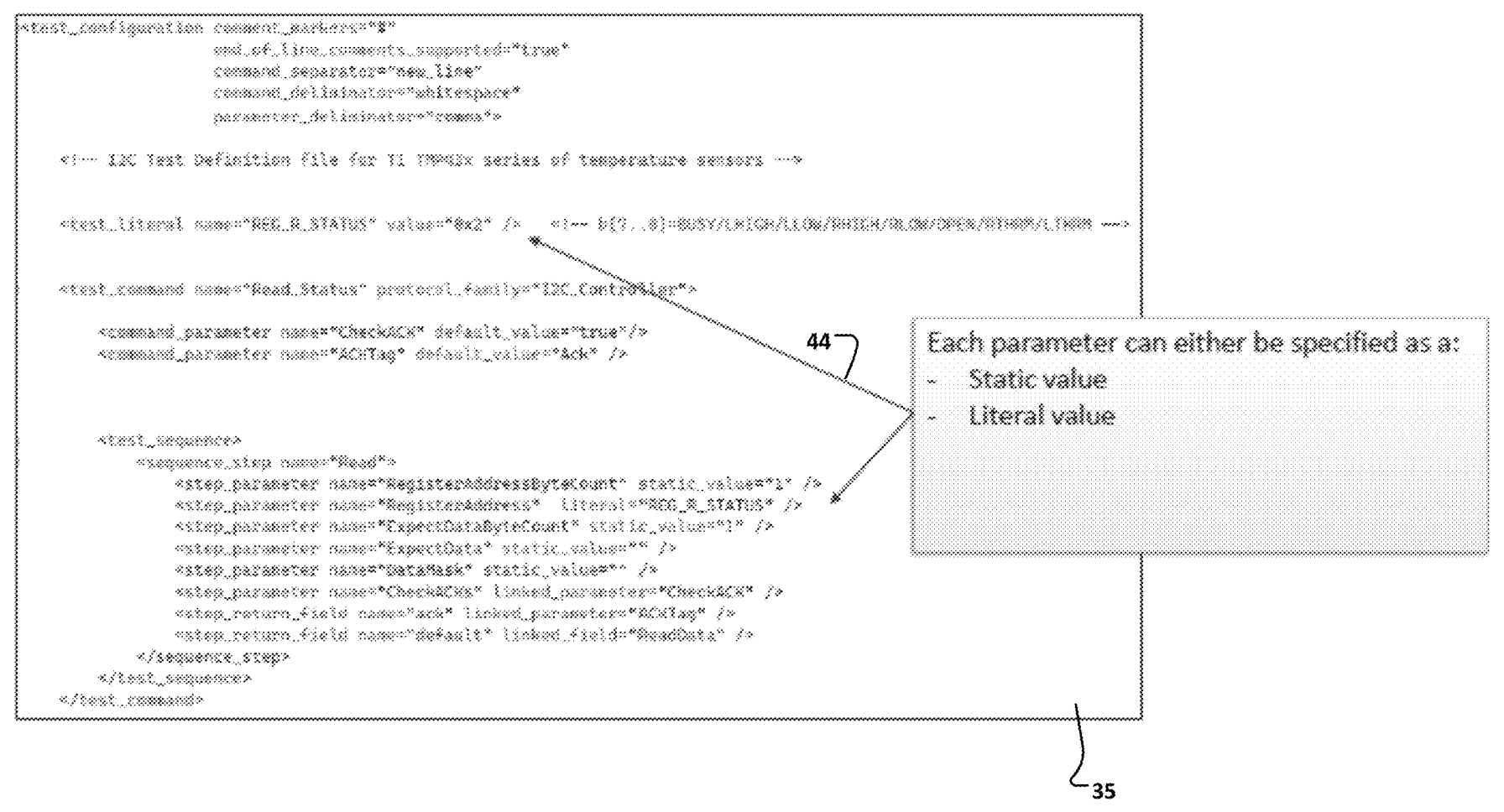
Figure 11:
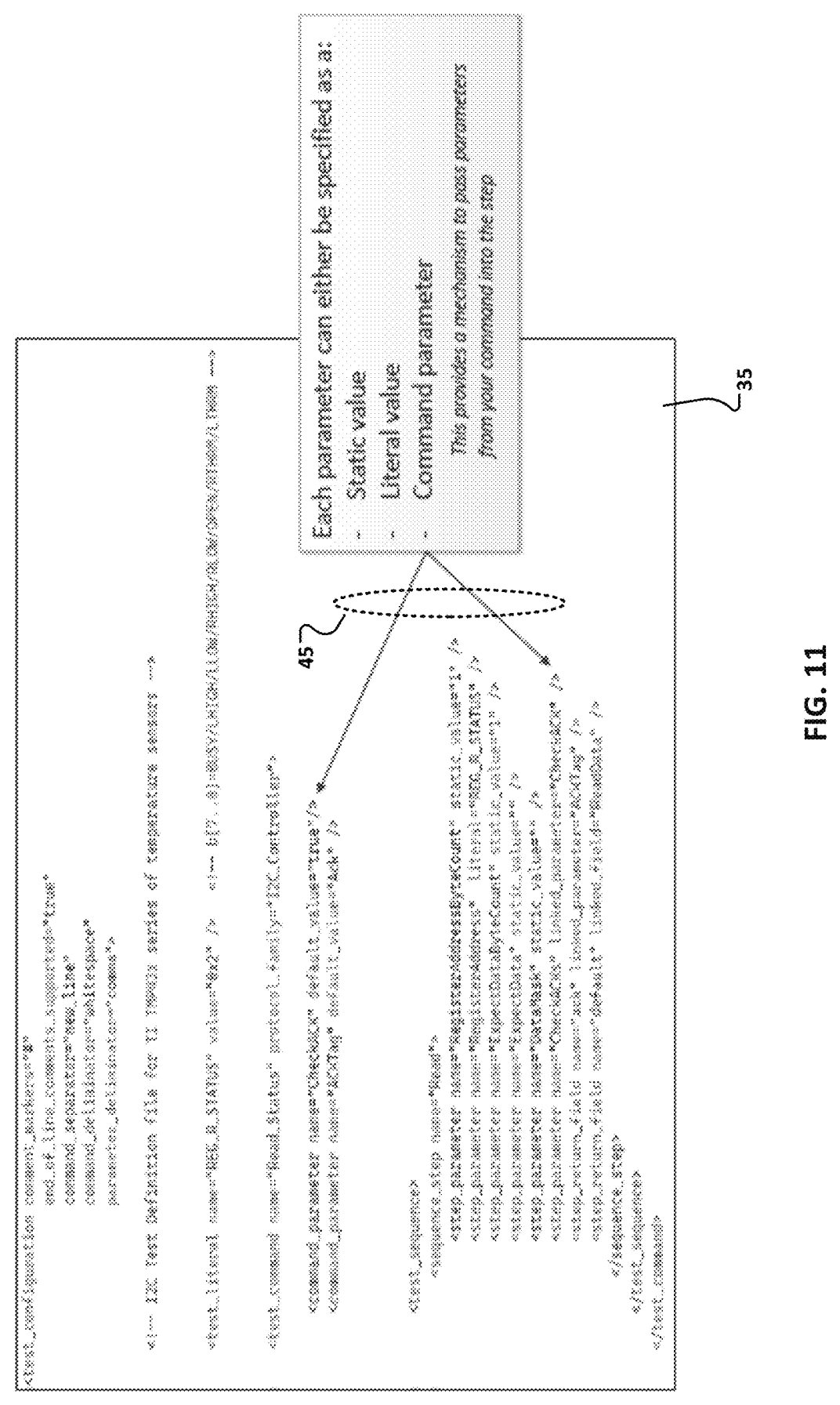

FIGS. 2 to 11 shown an example of part of a definitions file for a test program in the test entity syntax comprised of commands that ATE 10 interprets to generate commands in the ATE syntax. Referring to FIG. 2, code 32 in definitions file 35 defines file wide settings. Referring to FIG. 3, code 33 in definitions file 35 defines which characters indicate comments and whether the comments can be inline. Referring to FIG. 4, code 36 in definitions file 35 specifies how commands are separated from each other and from parameters and how parameters are separated from each other. Referring to FIG. 5, code 37 in definitions file 35 defines the number of literals that can be defined to be used as constants throughout the definitions file. Referring to FIG. 6, code 39 in definitions file 35 defines the name of the protocol family that the ATE supports. Referring to FIG. 7, code 40 in definitions file 35 defines the required parameters and operational parameters in the test entity syntax, where the required parameters come first and the operational parameters have a default value specified. Referring to FIG. 8, code 42 in definitions file 35 defines commands in the test entity syntax. Referring to FIGS. 9, 10, and 11 each parameter can be specified as a static value 43, a literal value 44, or a command parameter 45 that provides a mechanism to pass a parameter from an individual command into a command test syntax.

Figure 12:
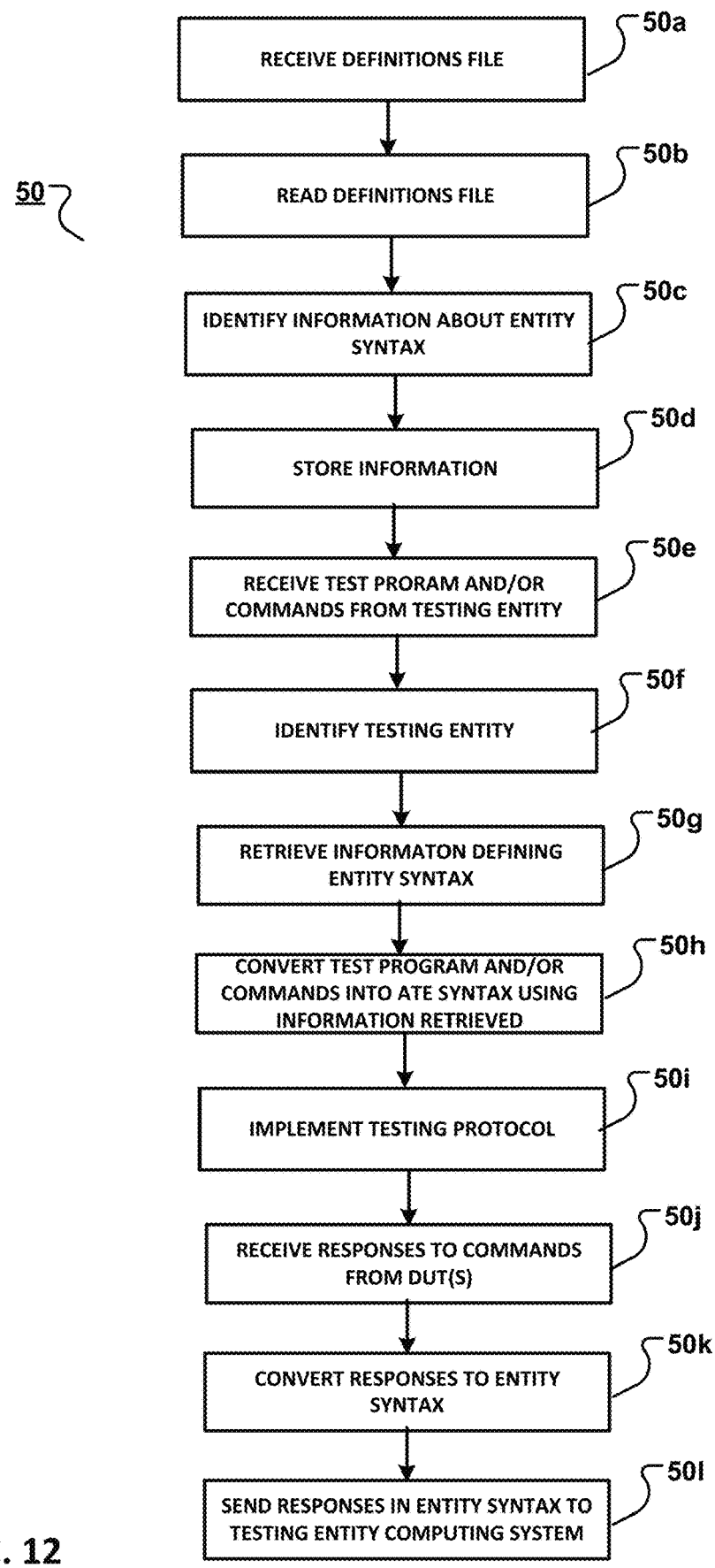
FIG. 12 is a flowchart showing an example process for converting between a third party command syntax and a test system command syntax.
Figure 1:
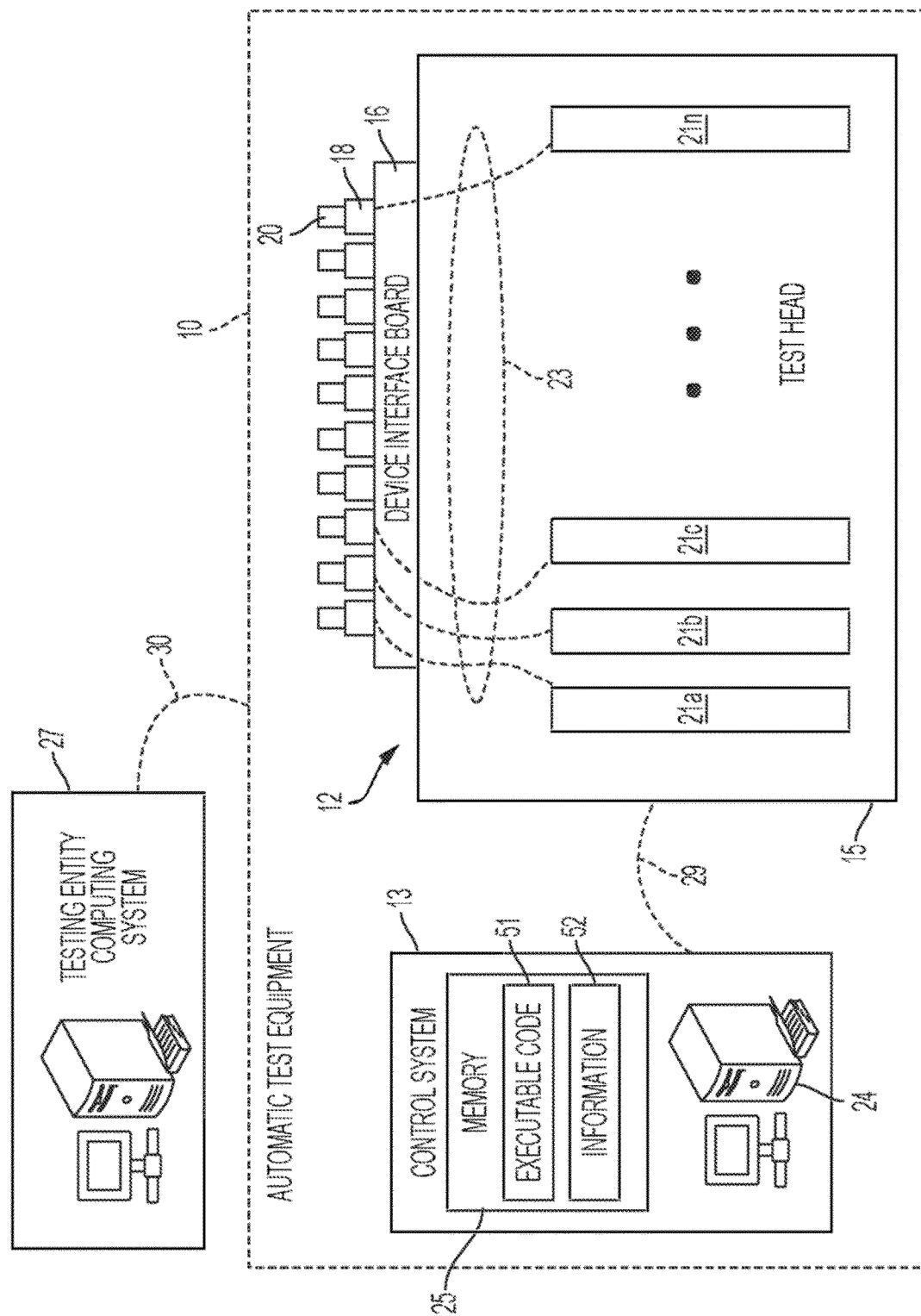
Figure 12:
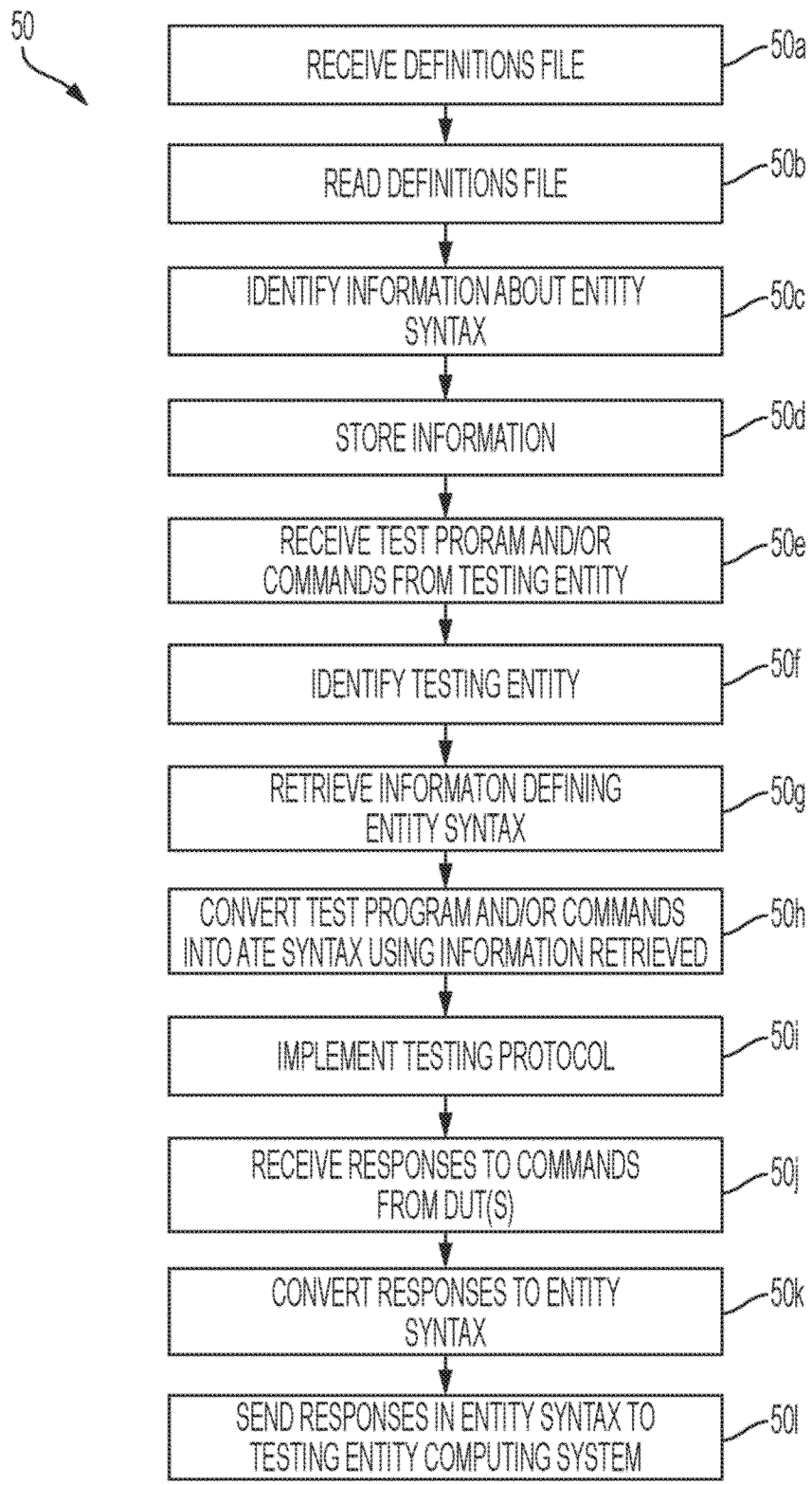

FIG. 12 shows an example process 50 that may be implemented using ATE 10 or any other appropriate computing and/or testing equipment. For example, process 50 may be implemented by executable code 51 stored in memory 25 on, or other memory accessible to, control system 13 (see FIG. 1). Process 50 includes receiving (50a) a definitions file from a testing entity. In some implementations, the definitions file may be received by control system 13. As noted, the definitions file, an example of which is depicted in FIGS. 2 to 11, may be in a self-describing computing language such as XML. The definitions file may be a template that is provided to the testing entity by the manufacturer of the ATE and that is filled-in and customized by the testing entity to define the entity syntax. The definitions file may be generated by the testing entity without input from the ATE manufacturer, e.g., without use of a manufacturer-provided template.

Following receipt of the definitions file, process 50 may execute a parser program or other computer program to read (50b) the definitions file. The parser program may be part of executable code 51. The parser program reads the definitions file to identify (50c) information about the entity syntax form the definitions file. In FIG. 13, examples of such information 52 is shown in tabular format. Information 52 includes the content of a read command 56 in the entity syntax, the content of a write command 57 in the entity syntax, and the content of a wait command 58 in the entity syntax. For each such command, information 52 includes parameters 60 for the command, a type 61 of the parameter, whether the parameter is required or not 62, and any notes or defaults 63 for each parameter. Other information not shown in FIG. 13 may also be included such as the format of each type of command, delimiters therefor, and the like.

Process 50 may store (50d) the information 52 defining the entity syntax in memory 25 in association with an identifier for the test entity. For example, information 52 may be stored in one or more look-up tables (LUTs) or other type of data structure. Operations 50*a* to 50*d* may be performed at a time prior to the subsequent operations 50*e* to 50*l* of process 50, e.g., days, weeks, months, or years prior to the subsequent operations 50*e* to 50*l*.

Process 50 receives (50*e*) a test program and/or commands from the testing entity—for example, from the test entity's computing system 27—in order to test the DUTs provided by the testing entity using ATE 10. The test program and/or commands are part of a testing protocol developed by the testing entity and to be implemented by ATE 10. The test program and/or commands are in the entity syntax. In the entity syntax, the ATE is not able to understand the test program and/or commands and to use the test program and/or commands to test the DUT. Accordingly, process 50 identifies (50*f*) the testing entity based, for example, on information such as an entity identifier provided with the test program and/or commands, based on information provided manually by a test engineer, or by any other appropriate method. Process retrieves (50*g*) the information 52 defining the entity syntax from memory 25 based on the identity of the testing entity.

Process 50 uses the information 52 defining the entity syntax to convert (50*h*) the test program and/or commands received from the testing entity in the entity syntax into a test program and/or commands in the ATE syntax that has the same functionality as the received test program and/or commands in the entity syntax. For example, process may use the information 52 defining the entity syntax to convert commands in the entity syntax into commands in the ATE syntax. For example, if a command is defined by "command_" in the entity syntax and if the same command is defined by "command:" in the ATE syntax, process 50 converts such commands in the received test program and/or commands from "command_" to "command:". In some cases, the conversion process may not be a one-to-one conversion. For example, a single command in the entity syntax may convert to multiple commands in the ATE syntax. For example, a set of commands in the entity syntax may convert to a single command in the ATE syntax. The conversion performed by process 50 produces a test program and/or commands in the ATE syntax. The ATE uses this test program and/or commands in the ATE syntax to implement the testing protocol (50*i*) developed by the testing entity to test the DUT. Except that, rather than using the test program and/or commands in the entity syntax, the ATE uses the test program and/or commands in the ATE syntax.

The conversion process is transparent to (e.g., not evident to) the testing entity, even in cases of real-time testing. In an example, real-time testing may include actions that occur on a continuous basis or that track each other in time, taking into account delays associated with processing, data transmission, hardware, and the like. During real-time testing, rather than sending a test program to the ATE, the testing entity may send individual commands or streams of commands to ATE 10, wait for responses from the DUT, and then send additional individual commands or streams of commands following and/or based on the responses. The individual commands or streams of commands received from the testing entity are converted by process 50 into individual commands or streams of commands in the ATE syntax essentially without the testing entity realizing that there has been a conversion. As a result, from the testing entity's perspective, the testing can be performed using the entity syntax. The testing entity therefore need not conform to the ATE syntax. ATE 10 may support any entity syntax for which a definitions file is provided.

Regarding the responses from the DUT to the test program and/or commands in the ATE syntax, those responses constitute test results. Process 50 receives (50*j*) these test results, converts (50K) the test results into the entity syntax, and sends (50*l*) the test results in the entity syntax to the testing entity's computing system 27. The information 52 from memory 25 may be retrieved to perform the conversion from ATE syntax to entity syntax. The test results may be sent to the testing entity as they come in or may be stored in memory and then sent en masse. When the testing is interactive—for example, during debug testing—the test results may be sent to the testing entity as they come in, along with the commands (including parameters, variables, instructions, and the like) or identities of the commands that generated the test results. Process 50 converts both the test results and the commands (or identities thereof) that generated the test results into the entity syntax prior to sending the test results and the commands (or identities thereof) that generated the test results to the testing entity.

The test results in the entity syntax and the commands that generated the test results in the entity syntax may be used by the testing entity as part of a debug process to identify, in real-time, reactions of the DUT to particular stimuli produced by one or more test commands. The test results in the entity syntax and the commands that generated the test results in the entity syntax may be output to a debug program that is owned and/or operated by the testing entity on its computing system 27. In some implementations, the debug program may be owned and/or operated by the ATE manufacturer or provider and may be usable the testing entity. The debug program may show the test results in the entity syntax and the commands that generated the test results in the entity syntax in real-time, enabling modifications to be made to the testing protocol in real-time, for example.

An example graphical user interface (GUI) 60 generated by a debug program is shown in FIG. 14. GUI 60 includes an area 61 displaying the commands and components thereof in the entity syntax, and an area 62 displaying general results of testing one or more DUTs using the commands in area 61, including how many DUTs have failed and data therefrom. Area 63 shows detailed information about the failure of the DUTs. A testing entity may thus send commands to the DUT in the entity syntax and view those commands and DUT responses thereto in the entity syntax. At the ATE, the above-described conversions between the entity syntax and the ATE syntax are performed to enable such the testing.

All or part of the test systems and processes described in this specification and their various modifications may be configured or controlled at least in part by one or more computers such as control system 13 using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test system and processes described herein can be performed by one or more programmable processors executing one or more computer programs to control or to perform all or some of the operations described herein. All or part of the test systems and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks.

Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A test system comprising:
a test instrument configured to test a device under test (DUT), the test instrument being configured to interact with the DUT using first commands having a first syntax; and
one or more processing devices configured to perform operations comprising (i) receiving a definitions file, the definitions file comprising information defining a second syntax that is used by a third party to communicate with the DUT, the information comprising a character structure that a processing device can interpret and that is used by the second syntax but not by the first syntax, (ii) storing, in memory, the information defining the second syntax in association with an identity of the third party, (iii) after storing the information in memory, receiving an identifier for the third party and second commands having a same functionality as the first commands and the second syntax, (iv) retrieving the information defining the second syntax from the memory based on the identity of the third party, (v) converting the second commands into the first commands having the first syntax based on the information retrieved, and (vi) enabling the test instrument to interact with the DUT using the first commands.

2. The test system of claim 1, wherein the operations comprise receiving test data from the DUT, and outputting the test data in the second syntax to a debugging program.

3. The test system of claim 1, wherein individual ones of the second commands convert to multiple ones of the first commands.

4. The test system of claim 1, wherein the definitions file is customized by the third party; and
wherein the second syntax is based on a communications protocol that is native to the third party for communication with the DUT.

5. The test system of claim 1, wherein the operations comprise executing a parser to parse the information in the definitions file, and identifying the character structure of the second syntax.

6. The test system of claim 5, wherein the information also identifies what defines comments in the second syntax and what defines parameters in the second syntax.

7. The test system of claim 1, wherein the second commands are part of a test program received from the third party to test the DUT.

8. The test system of claim 7, wherein the test instrument is configured to interact with the DUT during production testing; and
wherein, during production testing, the test program is not changeable and a design of the DUT is finalized.

9. The test system of claim 8, wherein operations comprise receiving test data from the DUT following production testing, and outputting the test data in the second syntax to a computing system associated with the third party.

10. The test system of claim 1, wherein the conversion file is a markup language format file.

11. One or more machine-readable storage devices storing instructions that are executable by one or more processing devices to enable a test instrument configured to test a device under test (DUT) to interact with the DUT using first commands having a first syntax, the instructions being executable by the one or more processing devices to perform operations comprising:
receiving a definitions file, the definitions file comprising information defining a second syntax that is used by a third party to communicate with the DUT, the information comprising a character structure that the one or more processing devices can interpret and that is used by the second syntax but not by the first syntax;
storing, in memory, the information defining the second syntax in association with an identity of the third party;
after storing the information in memory, receiving an identifier for the third party and second commands having a same functionality as the first commands and the second syntax;
retrieving the information defining the second syntax from the memory based on the identity of the third party;
converting the second commands into the first commands having the first syntax based on the information retrieved; and
enabling the test instrument to use the first commands to interact with the DUT.

12. The one or more machine-readable storage devices of claim 11, wherein the operations comprise:
receiving test data from the DUT; and
outputting the test data in the second syntax to a debugging program.

13. The one or more machine-readable storage devices of claim 11, wherein individual ones of the second commands convert to multiple ones of the first commands.

14. The one or more machine-readable storage devices of claim 11, wherein the definitions file is customized by the third party; and
   wherein the second syntax is based on a communications protocol that is native to the third party for communication with the DUT.

15. The one or more machine-readable storage devices of claim 11, wherein the operations comprise:
   executing a parser to parse the information in the definitions file; and
   identifying the character structure of the second syntax from the definitions file.

16. The one or more machine-readable storage devices of claim 15, wherein the information also identifies what defines comments in the second syntax and what defines parameters in the second syntax.

17. The one or more machine-readable storage devices of claim 11, wherein the second commands are part of a test program received from the third party to test the DUT.

18. The one or more machine-readable storage devices of claim 17, wherein the test instrument is configured to interact with the DUT during production testing; and
   wherein, during production testing, the test program is not changeable and a design of the DUT is finalized.

19. The one or more machine-readable storage devices of claim 18, wherein the operations comprise:
   receiving test data from the DUT following production testing; and
   outputting the test data in the second syntax to a computing system associated with the third party.

20. The one or more machine-readable storage devices of claim 11, wherein the conversion file is a markup language format file.

21. The test system of claim 1, wherein the one or more processing devices are part of the test instrument or wherein the one or more processing devices are external to the test instrument.

22. The one or more machine-readable storage devices of claim 11, wherein the one or more processing devices are part of the test instrument or wherein the one or more processing devices are external to the test instrument.

* * * * *

UNITED STATES PATENT AND TRADEMARK OFFICE
CERTIFICATE OF CORRECTION

| | | |
|---|---|---|
| PATENT NO. | : 12,235,317 B2 | |
| APPLICATION NO. | : 18/096897 | |
| DATED | : February 25, 2025 | |
| INVENTOR(S) | : Richard W. Fanning | |

It is certified that error appears in the above-identified patent and that said Letters Patent is hereby corrected as shown below:

On the Title Page

Replace the illustrative print figure, with the corrected FIG. 1, as shown on the attached drawing sheet.

In the Drawings

Attached formal drawings filed on January 26, 2023, replace the originally filed drawings.

Signed and Sealed this
Twenty-second Day of April, 2025

Coke Morgan Stewart
*Acting Director of the United States Patent and Trademark Office*

Top level node defines file wide settings

```xml
<test_configuration comment_markers="#"
  end_of_line_comments_supported="true"
  command_separator="new_line"
  command_deliminator="whitespace"
  parameter_deliminator="comma">

<!-- I2C Test Definition file for TI TMP43x series of temperature sensors -->

<test_literal name="REG_R_STATUS" value="0x2" />   <!-- b[7..0]=BUSY/LHIGH/LLOW/RHIGH/RLOW/OPEN/RTHRM/LTHRM -->

<test_command name="Read_Status" protocol_family="I2C_Controller">
  <command_parameter name="CheckACK" default_value="true"/>
  <command_parameter name="ACKTag" default_value="Ack" />
  <test_sequence>
    <sequence_step name="Read">
      <step_parameter name="RegisterAddressByteCount" static_value="1" />
      <step_parameter name="RegisterAddress" literal="REG_R_STATUS" />
      <step_parameter name="ExpectDataByteCount" static_value="1" />
      <step_parameter name="ExpectData" static_value="" />
      <step_parameter name="DataMask" static_value="" />
      <step_parameter name="CheckACKs" linked_parameter="CheckACK" />
      <step_return_field name="ack" linked_parameter="ACKTag" />
      <step_return_field name="default" linked_field="ReadData" />
    </sequence_step>
  </test_sequence>
</test_command>
```

FIG. 2

```xml
<test_configuration comment_markers="#"
    end_of_line_comments_supported="true"
    command_separator="new_line"
    command_deliminator="whitespace"
    parameter_deliminator="comma">
```
[33] Define which characters indicate comments and whether they can be inline

```xml
<!-- I2C Test Definition file for TI TMP43x series of temperature sensors -->

<test_literal name="REG_R_STATUS" value="0x2" /> <!-- b[7..0]=BUSY/LHIGH/LLOW/RHIGH/RLOW/OPEN/RTHRM/LTHRM -->

<test_command name="Read_Status" protocol_family="I2C_Controller">
    <command_parameter name="CheckACK" default_value="true"/>
    <command_parameter name="ACKTag" default_value="Ack"/>
    <test_sequence>
        <sequence_step name="Read">
            <step_parameter name="RegisterAddressByteCount" static_value="1" />
            <step_parameter name="RegisterAddress" literal="REG_R_STATUS" />
            <step_parameter name="ExpectDataByteCount" static_value="1" />
            <step_parameter name="ExpectData" static_value="" />
            <step_parameter name="DataMask" static_value="" />
            <step_parameter name="CheckACKs" linked_parameter="CheckACK" />
            <step_return_field name="ack" linked_parameter="ACKTag" />
            <step_return_field name="default" linked_field="ReadData" />
        </sequence_step>
    </test_sequence>
</test_command>
```

FIG. 3

```xml
<test_configuration comment_markers="#"
    end_of_line_comments_supported="true"
    command_separator="new_line"
    command_deliminator="whitespace"
    parameter_deliminator="comma">

<!-- I2C Test Definition file for TI TMP43x series of temperature sensors -->

<test_literal name="REG_R_STATUS" value="0x2" />

<test_command name="Read_Status" protocol_family="I2C_Controller">
    <command_parameter name="CheckACK" default_value="true"/>
    <command_parameter name="ACHTag" default_value="Ack"/>
    <!-- b[7..0]=BUSY/LHIGH/LLOW/RHIGH/RLOW/OPEN/RTHRM/LTHRM -->
    <test_sequence>
        <sequence_step name="Read">
            <step_parameter name="RegisterAddressByteCount" static_value="1" />
            <step_parameter name="RegisterAddress" literal="REG_R_STATUS" />
            <step_parameter name="ExpectDataByteCount" static_value="1" />
            <step_parameter name="ExpectData" static_value=" " />
            <step_parameter name="DataMask" static_value=" " />
            <step_parameter name="CheckACKs" linked_parameter="CheckACK" />
            <step_return_field name="ack" linked_parameter="ACKTag" />
            <step_return_field name="default" linked_field="ReadData" />
        </sequence_step>
    </test_sequence>
</test_command>
```

Specifies how commands are separated from each other and the parameters and how parameters are separated from each other

FIG. 4

```xml
<test_configuration comment_markers="#"
    end_of_line_comments_supported="true"
    command_separator="new_line"
    command_deliminator="whitespace"
    parameter_deliminator="comma">

<!-- I2C Test Definition file for TI TMP43x series of temperature sensors -->

<test_literal name="REG_R_STATUS" value="0x2" />  <!-- b[7..0]=BUSY/LHIGH/LLOW/RHIGH/RLOW/OPEN/RTHRM/LTHRM -->

<test_command name="Read_Status" protocol_family="I2C_Controller">
    <command_parameter name="CheckACK" default_value="true"/>
    <command_parameter name="ACKTag" default_value="Ack"/>
    <test_sequence>
        <sequence_step name="Read">
            <step_parameter name="RegisterAddressByteCount" static_value="1" />
            <step_parameter name="RegisterAddress" literal="REG_R_STATUS" />
            <step_parameter name="ExpectDataByteCount" static_value="1" />
            <step_parameter name="ExpectData" static_value="1" />
            <step_parameter name="DataMask" static_value="1" />
            <step_parameter name="CheckACKs" linked_parameter="CheckACK" />
            <step_return_field name="ack" linked_parameter="ACKTag" />
            <step_return_field name="default" linked_field="ReadData" />
        </sequence_step>
    </test_sequence>
</test_command>
```

Any number of literals can be defined to be used as constants throughout the rest of this file

FIG. 5

```xml
<test_configuration comment_markers="#"
 end_of_line_comments_supported="true"
 command_separator="new_line"
 command_deliminator="whitespace"
 parameter_deliminator="comma">

<!-- I2C Test Definition file for TI TMP43x series of temperature sensors -->

<test_literal name="REG_R_STATUS" value="0x2" />    <!-- b[7..0]=BUSY/LHIGH/LLOW/RHIGH/RLOW/OPEN/RTHRM/LTHRM -->

<test_command name="Read_Status" protocol_family="I2C_Controller">
<command_parameter name="CheckACK" default_value="true"/>
<command_parameter name="ACHTag" default_value="Ack"/>
<test_sequence>
<sequence_step name="Read">
<step_parameter name="RegisterAddressByteCount" static_value="1" />
<step_parameter name="RegisterAddress" literal="REG_R_STATUS" />
<step_parameter name="ExpectDataByteCount" static_value="1" />
<step_parameter name="ExpectData" static_value=" " />
<step_parameter name="DataMask" static_value=" " />
<step_parameter name="CheckACKs" linked_parameter="CheckACK" />
<step_return_field name="ack" linked_parameter="ACKTag" />
<step_return_field name="default" linked_field="ReadData" />
</sequence_step>
</test_sequence>
</test_command>
```

*The name can be any string that does not contain a delimiter specified.*

*The protocol family can be any protocol the ATE supports.*

FIG. 6

```
<test_configuration  comment_markers="#"
                     end_of_line_comments_supported="true"
                     command_separator="new_line"
                     command_deliminator="whitespace"
                     parameter_deliminator="comma">

<!-- I2C Test Definition file for TI TMP43x series of temperature sensors -->

<test_literal name="REG_R_STATUS" value="0x2" />    <!-- b[7..0]=BUSY/LHIGH/LOW/RHIGH/RLOW/OPEN/RTHRM/LTHRM -->

<test_command name="Read_Status" protocol_family="I2C_Controller">
    <command_parameter name="CheckACK" default_value="true"/>
    <command_parameter name="ACKTag" default_value="Ack" />
    <test_sequence>
        <sequence_step name="Read">
            <step_parameter name="RegisterAddressByteCount" static_value="1" />
            <step_parameter name="RegisterAddress" literal="REG_R_STATUS" />
            <step_parameter name="ExpectDataByteCount" static_value="1" />
            <step_parameter name="ExpectData" static_value="" />
            <step_parameter name="DataMask" static_value="" />
            <step_parameter name="CheckACKs" linked_parameter="CheckACK" />
            <step_return_field name="ack" linked_parameter="ACKTag" />
            <step_return_field name="default" linked_field="ReadData" />
        </sequence_step>
    </test_sequence>
</test_command>
```

Any number of required or optional parameters can be specified.

Required parameters must come first and optional parameters must have a default value specified.

FIG. 7

```xml
<test_configuration comment_markers="#"
    end_of_line_comments_supported="true"
    command_separator="new_line"
    command_deliminator="whitespace"
    parameter_deliminator="comma">

<!-- I2C Test Definition file for TI TMP43x series of temperature sensors -->

<test_literal name="REG_R_STATUS" value="0x2" />    <!-- b[7..0]=BUSY/LHIGH/LLOW/RHIGH/RLOW/OPEN/RTHRM/LTHRM -->

<test_command name="Read_Status" protocol_family="I2C_Controller">
    <command_parameter name="CheckACK" default_value="true"/>
    <command_parameter name="ACHTag" default_value="Ack" />
    <test_sequence>
        <sequence_step name="Read">
            <step_parameter name="RegisterAddressByteCount" static_value="1" />
            <step_parameter name="RegisterAddress" literal="REG_R_STATUS" />
            <step_parameter name="ExpectDataByteCount" static_value="1" />
            <step_parameter name="ExpectData" static_value="" />
            <step_parameter name="DataMask" static_value="" />
            <step_parameter name="CheckACKs" linked_parameter="CheckACK" />
            <step_return_field name="ack" linked_parameter="ACKTag" />
            <step_return_field name="default" linked_field="ReadData" />
        </sequence_step>
    </test_sequence>
</test_command>
```

{ 42 — The rest of the file is under defined commands. These allow mapping of the commands already present in test files to actions the ATE knows how to perform.

35

FIG. 8

```
<test_configuration comment_markers="#"
     end_of_line_comments_supported="true"
     command_separator="new_line"
     command_delimiator="whitespace"
     parameter_delimiator="comma"/>

<!-- I2C Test Definition file for TI TMP43x series of temperature sensors -->

<test_literal name="REG_R_STATUS" value="0x2"/>    <!-- b[7..0]=BUSY/LHIGH/LLOW/RHIGH/RLOW/OPEN/RTHRM/LTHRM -->

<test_command name="Read_Status" protocol_family="I2C_Controller">
    <command_parameter name="CheckACK" default_value="true"/>
    <command_parameter name="ACKTag" default_value="Ack"/>
    <test_sequence>
        <sequence_step name="Read">
            <step_parameter name="RegisterAddressByteCount" static_value="1"/>
            <step_parameter name="RegisterAddress" literal="REG_R_STATUS"/>
            <step_parameter name="ExpectDataByteCount" static_value="1"/>
            <step_parameter name="ExpectData" static_value=""/>
            <step_parameter name="DataMask" static_value=""/>
            <step_parameter name="CheckACKs" linked_parameter="CheckACK"/>
            <step_return_field name="ack" linked_parameter="ACKTag"/>
            <step_return_field name="default" linked_field="ReadData"/>
        </sequence_step>
    </test_sequence>
</test_command>
```

Each parameter can either be specified as a:
- Static value

FIG. 9

```xml
<test_configuration comment_markers="#"
    end_of_line_comments_supported="true"
    command_separator="new_line"
    command_deliminator="whitespace"
    parameter_deliminator="comma"/>

<!-- I2C Test Definition file for TI TMP43x series of temperature sensors -->

<test_literal name="REG_R_STATUS" value="0x2" />  <!-- b[7..0]=BUSY/LHIGH/LLOW/RHIGH/RLOW/OPEN/RTHRM/LTHRM -->

<test_command name="Read_Status" protocol_family="I2C_Controller">
    <command_parameter name="CheckACK" default_value="true"/>
    <command_parameter name="ACKTag" default_value="Ack"/>
    <test_sequence>
        <sequence_step name="Read">
            <step_parameter name="RegisterAddressByteCount" static_value="1" />
            <step_parameter name="RegisterAddress" literal="REG_R_STATUS" />
            <step_parameter name="ExpectDataByteCount" static_value="1" />
            <step_parameter name="ExpectData" static_value="" />
            <step_parameter name="DataMask" static_value="" />
            <step_parameter name="CheckACKs" linked_parameter="CheckACK" />
            <step_return_field name="ack" linked_parameter="ACKTag"/>
            <step_return_field name="default" linked_field="ReadData" />
        </sequence_step>
    </test_sequence>
</test_command>
```

Each parameter can either be specified as a:
- Static value
- Literal value

FIG. 10

```xml
<test_configuration comment_markers="#"
    end_of_line_comments_supported="true"
    command_separator="new_line"
    command_deliminator="whitespace"
    parameter_deliminator="comma">

<!-- I2C Test Definition file for TI TMP43x series of temperature sensors -->

<test_literal name="REG_R_STATUS" value="0x2" />    <!-- b[7..0]=BUSY/LHIGH/LLOW/RHIGH/RLOW/OPEN/RTHRM/LTHRM -->

<test_command name="Read_Status" protocol_family="I2C_Controller">
<command_parameter name="CheckACK" default_value="true"/>
<command_parameter name="ACKTag" default_value="Ack" />
<test_sequence>
<sequence_step name="Read">
<step_parameter name="RegisterAddressByteCount" static_value="1" />
<step_parameter name="RegisterAddress" literal="REG_R_STATUS" />
<step_parameter name="ExpectDataByteCount" static_value="1" />
<step_parameter name="ExpectData" static_value="" />
<step_parameter name="DataMask" static_value="" />
<step_parameter name="CheckACKs" linked_parameter="CheckACK" />
<step_return_field name="ack" linked_parameter="ACKTag" />
<step_return_field name="default" linked_field="ReadData" />
</sequence_step>
</test_sequence>
</test_command>
```

Each parameter can either be specified as a:
- Static value
- Literal value
- Command parameter This provides a mechanism to pass parameters from your command into the step

FIG. 11

| Protocol Family | Step Command | Parameters | Type | Required | Default / Notes |
|---|---|---|---|---|---|
| I2C Controller | | | | | |
| | Read | | | | |
| | | RegisterAddress | Hex/Binary | Yes | |
| | | ExpectDataByteCount | Integer | Yes | |
| | | ExpectData | Hex/Binary | No | Empty String |
| | | DataMask | Hex/Binary | No | Empty String |
| | | RegisterAddressByteCount | Integer | No | -1(uses default) |
| | | CheckACKs | Boolean | No | True |
| | | ReadWhenA15ItsMaskedOff | Boolean | No | False |
| | | default (Return field) | | | |
| | | ack (Return field) | | | |
| | Write | | | | |
| | | RegisterAddress | Hex/Binary | Yes | |
| | | Data | Hex/Binary | Yes | |
| | | DataByteCount | Integer | Yes | |
| | | RegisterAddressByteCount | Integer | No | -1(uses default) |
| | | CheckACKs | Boolean | No | False |
| | | default/ack (Return field) | | | |
| | Wait | | | | |
| | | Time | Double | Yes | |
| | | Limit | String | No | Empty String (options y, c, o, f, p, n, u, m, k, N, G, T, P, E, Z, Y) |

FIG. 13

FIG. 14